United States Patent
Nakayama

(10) Patent No.: US 11,161,648 B2
(45) Date of Patent: Nov. 2, 2021

(54) PANEL STORAGE CONTAINER

(71) Applicant: Shin-Etsu Polymer Co., Ltd., Tokyo (JP)

(72) Inventor: Takayuki Nakayama, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 16/961,233

(22) PCT Filed: Jan. 8, 2019

(86) PCT No.: PCT/JP2019/000156
§ 371 (c)(1),
(2) Date: Jul. 9, 2020

(87) PCT Pub. No.: WO2019/138982
PCT Pub. Date: Jul. 18, 2019

(65) Prior Publication Data
US 2021/0061517 A1 Mar. 4, 2021

(30) Foreign Application Priority Data
Jan. 12, 2018 (JP) .............................. JP2018-003273

(51) Int. Cl.
*H01L 21/673* (2006.01)
*B65D 25/10* (2006.01)
(Continued)

(52) U.S. Cl.
CPC .......... *B65D 25/107* (2013.01); *B65D 85/48* (2013.01); *H01L 21/6734* (2013.01); *G02F 1/1303* (2013.01)

(58) Field of Classification Search
CPC ............. H01L 21/6734; H01L 21/6732; H01L 21/67383; H01L 21/37379; B65D 85/48; B65D 25/107
(Continued)

(56) References Cited

U.S. PATENT DOCUMENTS 8,322,733 B2 * 12/2012 Dill .................... B62B 3/108
280/79.3
2006/0011507 A1 * 1/2006 Uchida ................. B65D 85/48
206/711

FOREIGN PATENT DOCUMENTS

JP 2000007148 1/2000
JP 2004146578 5/2004
(Continued)

OTHER PUBLICATIONS

"Written Opinion of the International Searching Authority (Form PCT/ISA/237) of PCT/JP2019/000156," dated Apr. 9, 2019, with English translation thereof, pp. 1-10.
(Continued)

*Primary Examiner* — King M Chu
(74) *Attorney, Agent, or Firm* — JCIPRNET

(57) ABSTRACT

Provided is a panel storage container that can suppress flexure of the middle portions of the panels. A panel storage container has: a container body for storing panels; and a panel support means for supporting the panels. The panel support means has: a panel support portion for supporting right and left edges of the panels; a central support portion for supporting each middle portion of the panels; and elastic bodies for contacting the panels, the elastic bodies being provided along a front and rear direction of the central support portion at a predetermined interval.

11 Claims, 16 Drawing Sheets

(51) Int. Cl.
*B65D 85/48* (2006.01)
*G02F 1/13* (2006.01)

(58) Field of Classification Search
USPC ................ 206/454, 710, 711; 211/41.18
See application file for complete search history.

(56) References Cited

FOREIGN PATENT DOCUMENTS

| JP | 2005340480 | 12/2005 |
|---|---|---|
| JP | 2009126529 | 6/2009 |
| WO | 2010134492 | 11/2010 |

OTHER PUBLICATIONS

"International Search Report (Form PCT/ISA/210) of PCT/JP2019/000156," dated Apr. 9, 2019, with English translation thereof, pp. 1-4.

* cited by examiner

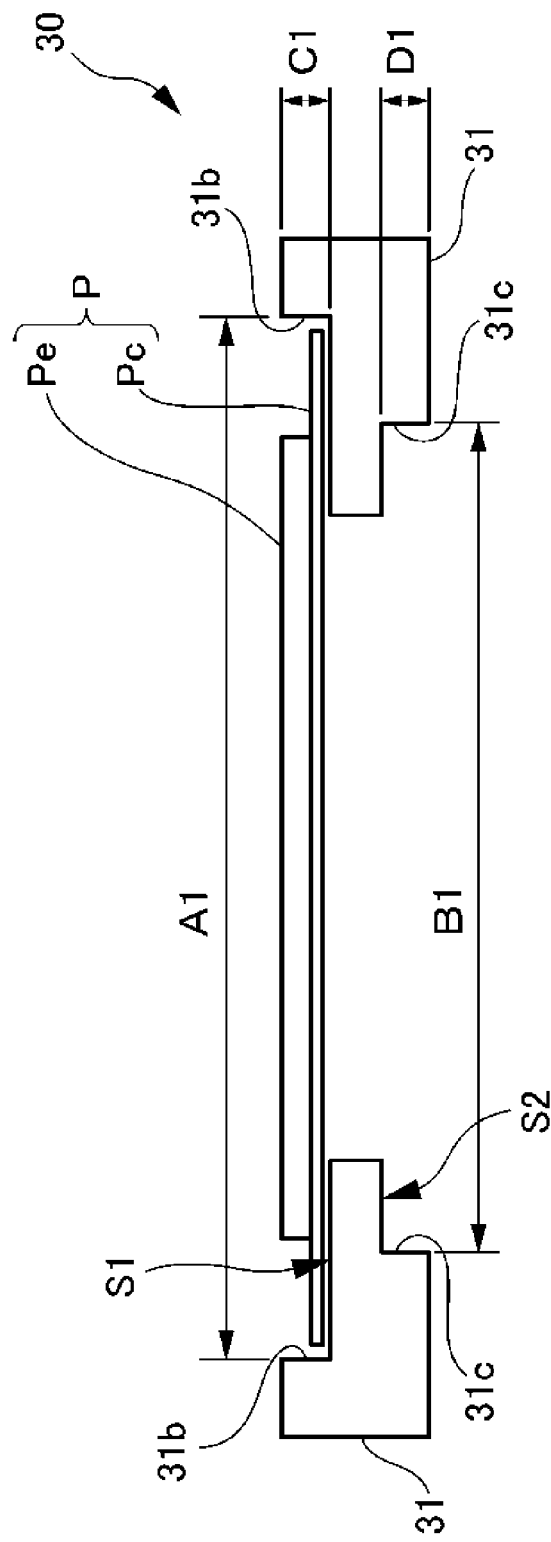
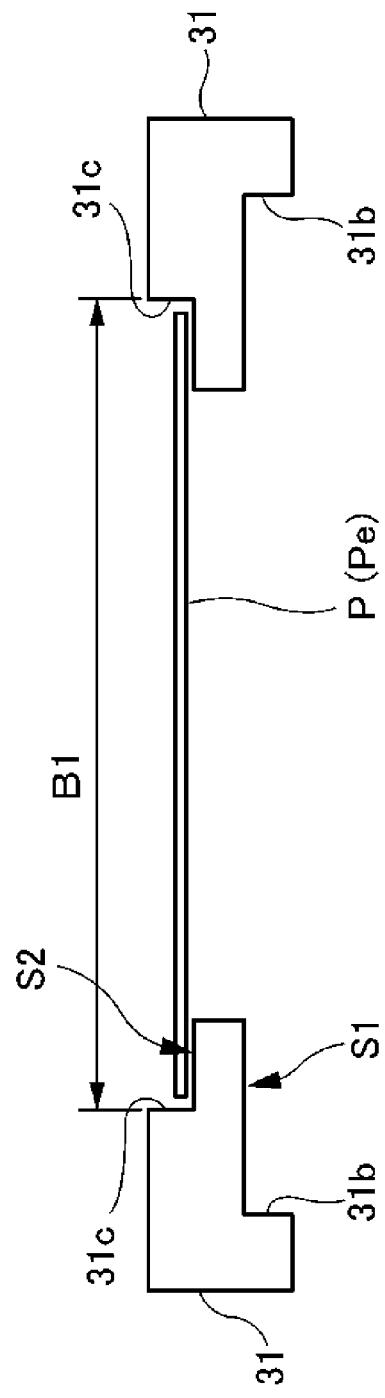
FIG. 8A
FIG. 8B

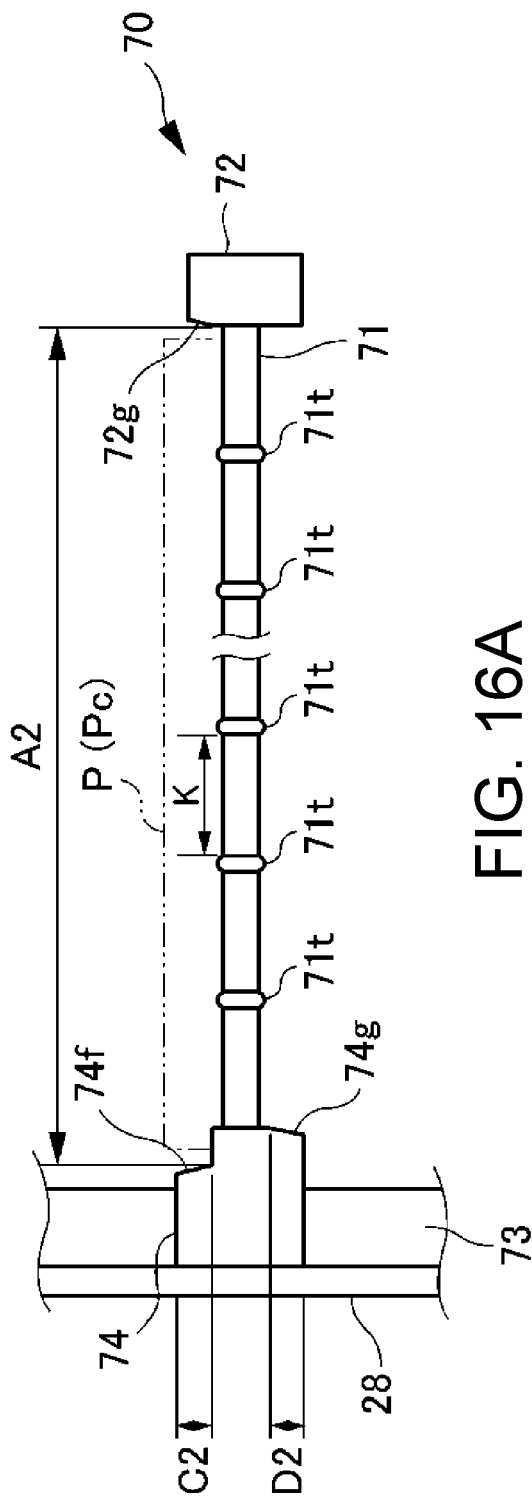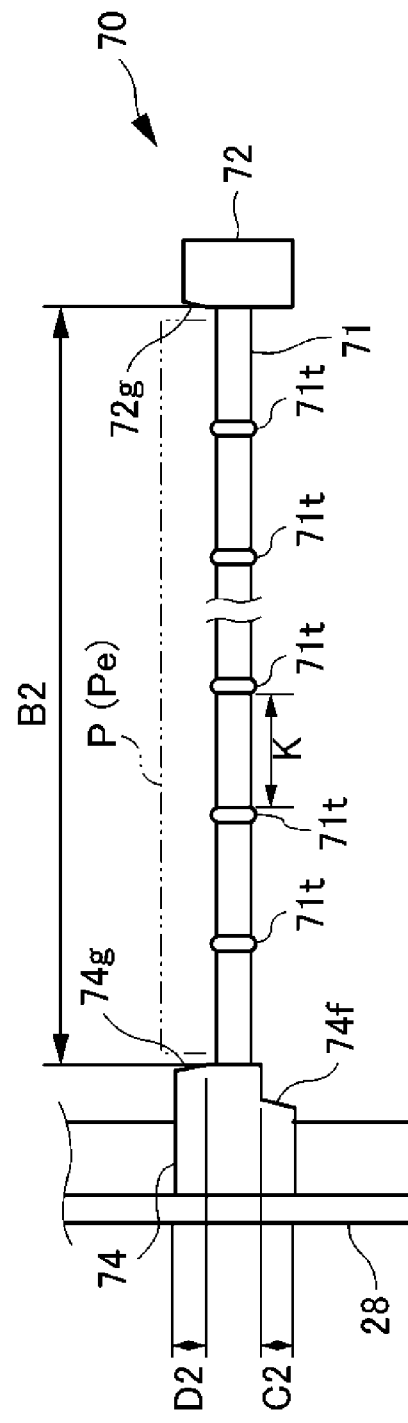

PANEL STORAGE CONTAINER

CROSS-REFERENCE TO RELATED APPLICATION

This application is a 371 application of the international PCT application serial no. PCT/JP2019/000156, filed on Jan. 8, 2019, which claims the priority benefits of Japan application no. 2018-003273 filed on Jan. 12, 2018. The entirety of each of the abovementioned patent applications is hereby incorporated by reference herein and made a part of this specification.

TECHNICAL FIELD

The present invention relates to a panel storage container for storing panels.

BACKGROUND ART

Panel storage containers for storing multiple panels are used in a manufacturing process dealing with panels such as glass substrates for liquid crystal panels in order to transfer the panels from a manufacturing device to another manufacturing device of another process or to temporarily store the panels (e.g., see Patent Literature 1).

Recently, liquid crystal panels have been getting larger. Concomitantly, carrier panels for the liquid crystal panels are also getting larger. Since larger carrier panels weigh heavier, for example, 5 to 8 kilograms per sheet, there is a need for strength of a panel support portion that supports the right and left edges of the carrier panel.

In addition to the case of the liquid crystal panels, multiple electronic components such as IC chips are formed on one panel for mass production, requiring the enlargement of the panels. The electronic components in a panel form are manufactured through, e.g., a process of adhering and mounting multiple electronic components on a large carrier panel (such as a glass plate and a stainless-steel plate), a process of sealing these electronic components with epoxy resin, a process of peeling the sealed electronic components from the carrier panel in the panel form, and a process of individually cutting out the electronic components from the panel form.

CITATION LIST

Patent Literature

[Patent Literature 1] International Publication No. 2010/134492

SUMMARY OF INVENTION

Technical Problem

However, when these large panels are supported at the right and left edges, the middle portion of each panel may bend and deform so that the panel may be damaged. Even if the panels do not get damaged, there may be inconveniences when transfer devices such as robots insert or take out such panels into or from the panel storage container.

The present disclosure has been made in view of the above circumstances. It is an object of the present disclosure to provide a panel storage container capable of suppressing the flexure of the middle portions of the panels.

Solution to Problem (1) One aspect of the present disclosure comprises a panel storage container including: a container body for storing panels; and a panel support means for supporting the panels. The panel support means includes: a panel support body for supporting right and left edges of the panels; a central support portion that extends along a front and rear direction and supports each middle portion of the panels; and elastic bodies contacting the panels, the elastic bodies being provided along a front and rear direction of the central support portion at a predetermined interval.

(2) In the aspect (1), the elastic bodies may be annular shaped.

(3) In the aspect (2), the cross section of the elastic bodies may be formed in a circular shape.

(4) In any one of the aspects (1) to (3), the panel support means may include a side support portion that extends along a front and rear direction and of which one end is attached to the container body. The elastic bodies may be provided along the front and rear direction of the side support portion at a predetermined interval.

(5) In the aspect (4), the side support portion may be a solid or hollow cylindrical member.

(6) In any one of the above aspects (1) to (5), the central support portion may be a solid or hollow cylindrical member.

(7) In the above aspect (5) or (6), multiple grooves for fitting with the elastic bodies may be provided in a circumferential surface of the solid or hollow cylindrical member.

(8) In any one of the aspects (1) to (7), the predetermined interval may range from 50 mm to 100 mm.

(9) In any one of the above aspects (1) to (8), a rear end of the central support portion in the front and rear direction may be attached to the container body via a support holding member, and a front end of the central support portion in the front and rear direction may be positioned backward of a front edge of the middle portion of each panel stored in the container body.

Advantageous Effects of Invention

According to the present disclosure, it is possible to provide a panel storage container capable of suppressing flexure of the middle portions of the panels.

BRIEF DESCRIPTION OF DRAWINGS

FIG. 8A is a schematic front view showing the panel support bodies attached in a changed direction with a panel positioning dimension A1.

FIG. 8B is a schematic front view showing the panel support bodies attached in a changed direction with a panel positioning dimension B1.

FIG. 16A is a schematic side view showing the side support portion attached in a changed direction with a panel positioning dimension A2.

FIG. 16B is a schematic side view showing the side support portion attached in a changed direction with a panel positioning dimension B2.

DESCRIPTION OF EMBODIMENTS

Hereinafter, a panel storage container 1 according to an embodiment of the present disclosure will be described in detail while referring to the attached drawings.

First Embodiment

[Overall Configuration of Panel Storage Container]

Figure 1:
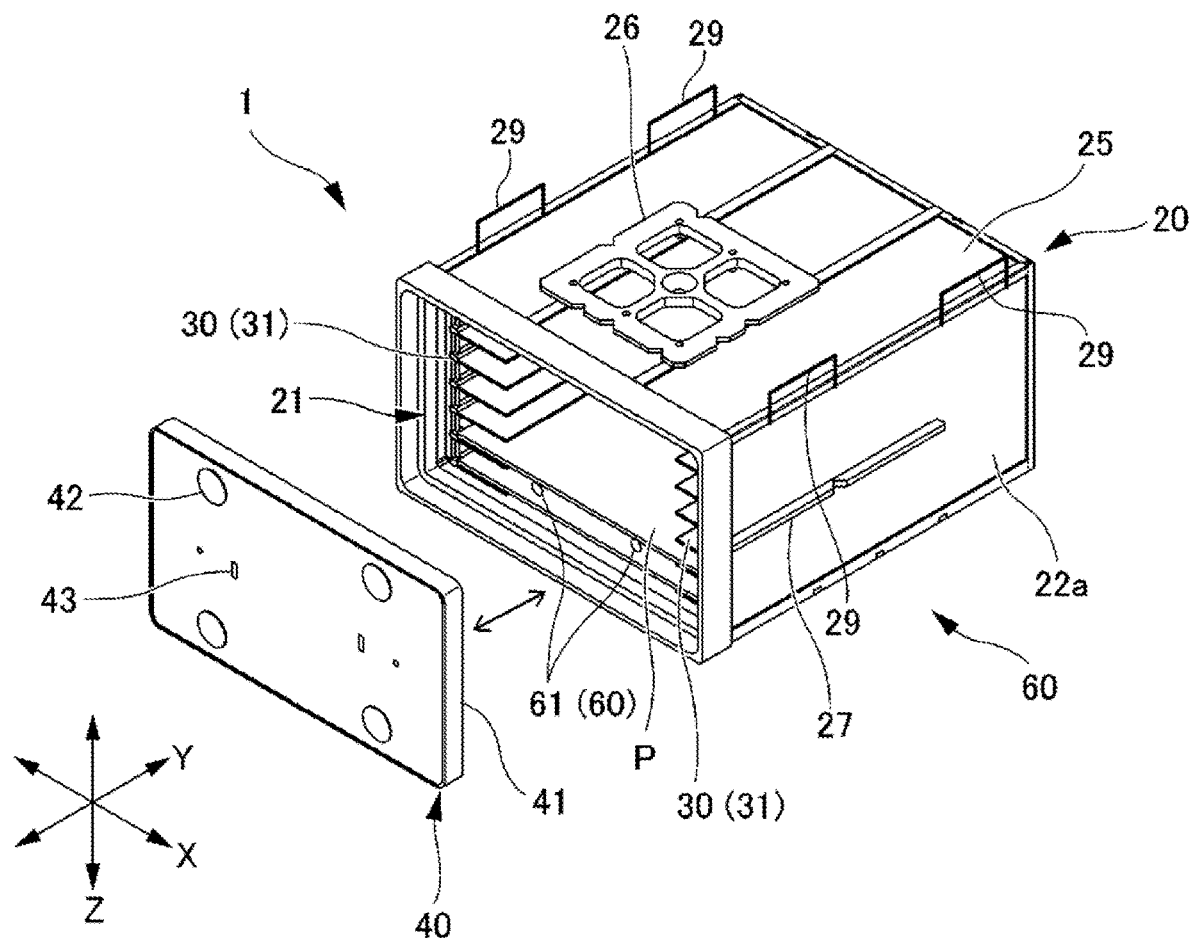
FIG. 1 is an exploded perspective view of a panel storage container of a first embodiment according to the present invention.
Figure 2:
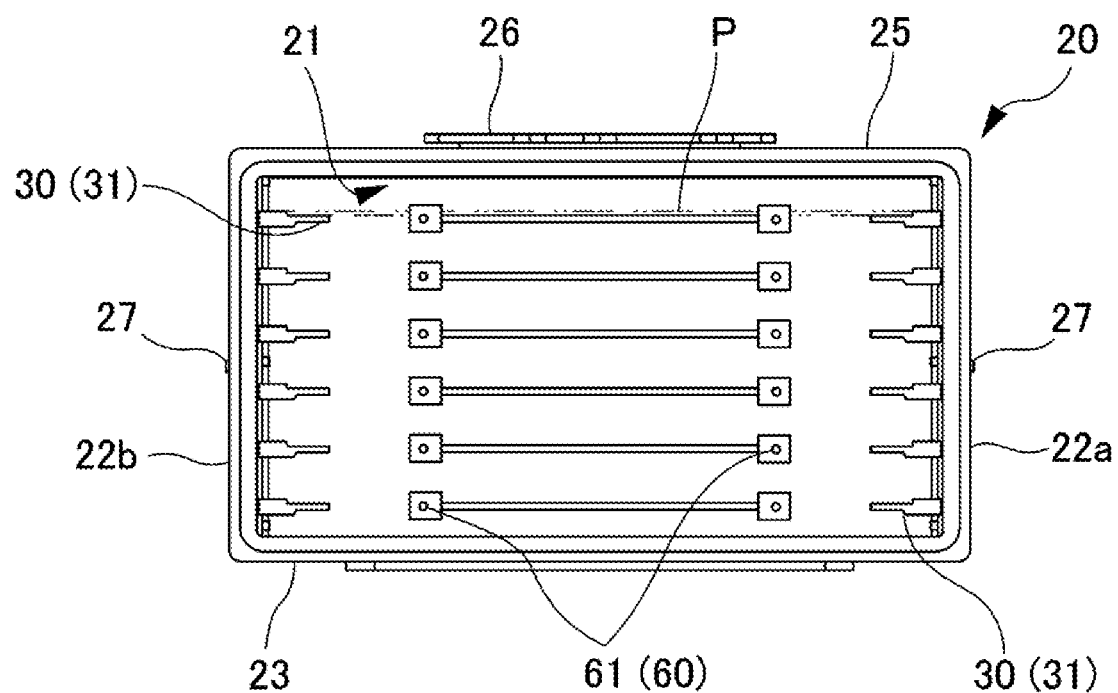
FIG. 2 is a front view of a container body.
Figure 3:
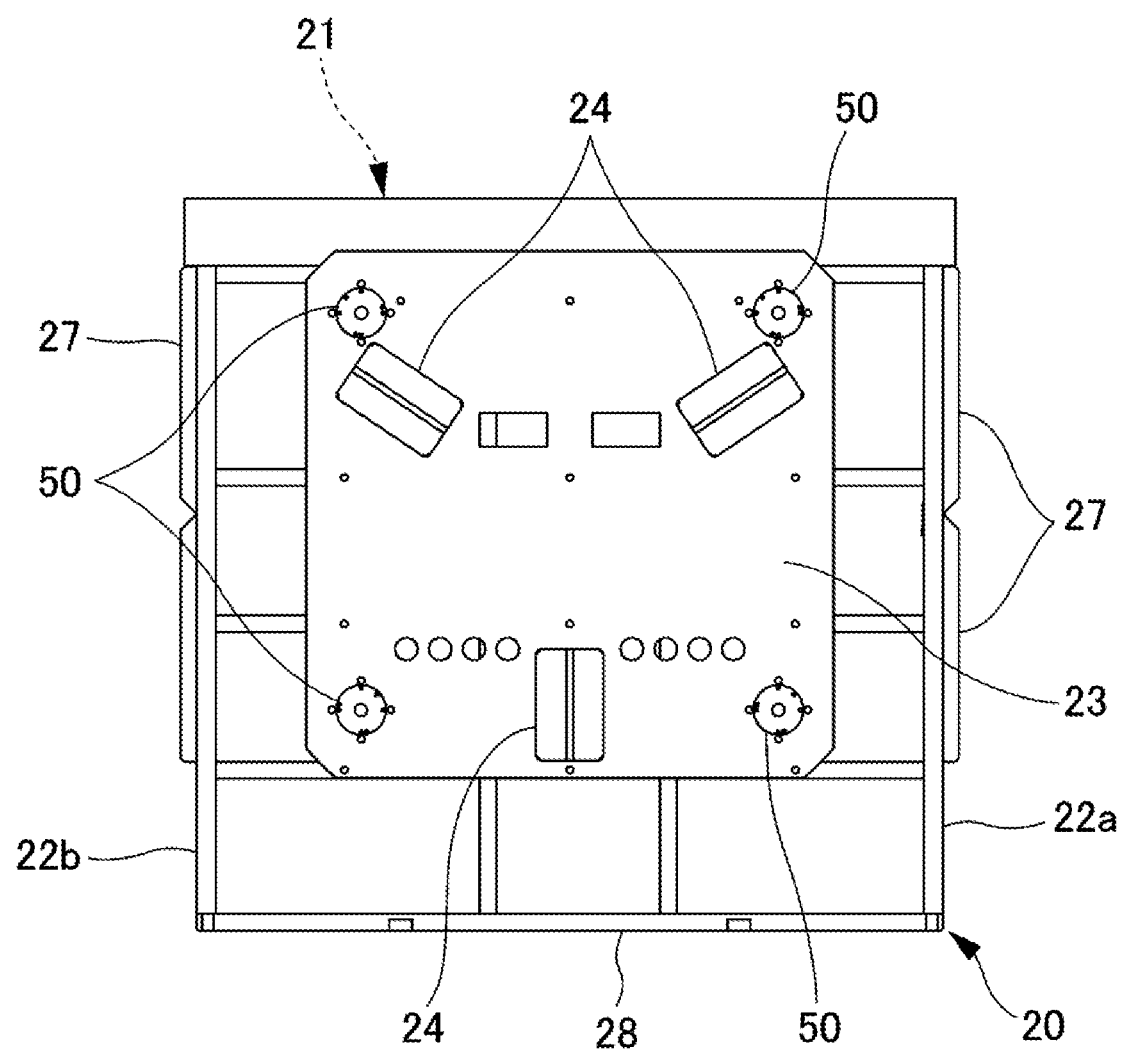
FIG. 3 is a bottom view of the container body.

FIG. 1 is an exploded perspective view of a panel storage container 1 of a first embodiment according to the present disclosure. FIG. 2 is a front view of a container body 20. FIG. 3 is a bottom view of the container body 20. Note that, in FIG. 1, the X direction extending along the X-axis is defined as the right and left direction, the Y direction extending along the Y-axis is defined as the front and rear direction and the Z direction extending along the Z-axis is defined as the up and down direction.

As shown in FIG. 1 to FIG. 3, the panel storage container 1 of the present embodiment includes: a container body 20 that stores multiple rectangular panels P (e.g., 6, 12, ..., 25 panels); and a lid 40 that openably and closably covers an opening 21 formed in front of the container body 20.

The panel storage container 1 is used in a manufacturing apparatus (a manufacturing process) for manufacturing electronic components. For example, the panel storage container 1 is used to transfer the panels P between processes such as: a process for forming multiple electronic components on a large carrier panel Pc like a glass plate or a stainless-steel plate (see FIG. 8A), a process for sealing these electronic components with epoxy resin or the like, a process for peeling the sealed electronic components (in a panel form) from the carrier panel Pc, and a process for cutting out the electronic components from the sealing panel Pe. Thus, the size of the panels P stored in the panel storage container 1 includes two types of: 625 mm×615 mm, which is the size of the carrier panel Pc; and 600 mm×600 mm, which is the size of sealing panel Pe, for example. Hence, two or more types of panel storage containers 1 may be prepared for each size of the panels.

The container body 20 is a front open box type container having the opening 21 in front. The container body 20 has a panel support portion 30 for supporting right and left edges of the panel P and a central support portion 60 for supporting a middle portion between the right and left edges of the panel P. Specifically, the panel support portion 30 is provided in pair on inner surfaces of right and left side walls 22a, 22b. The central support portion 60 is provided on an inner surface of a rear wall 28. The panel support portion 30 and the central support portion 60 will be described in detail later. The container body 20 of the present embodiment is configured by assembling a frame body into a rectangular parallelepiped shape and by attaching, on the frame body, wall members that airtightly cover upper, lower, left side, right side and rear surfaces of the frame body. However, the structure of the container body 20 is not limited thereto.

For gas replacement to maintain the cleanliness and low humidity inside the panel storage container 1, a bottom plate 23 of the container body 20 may be provided with multiple air supply/exhaust units 50 for supplying an inert gas into the container body 20 or exhausting the air from the container body 20. In this embodiment, two of the air supply/exhaust units 50 on the opening 21 side are exhaust units, while two on the rear side (back side) are air exhaust units, for example. However, the number of the air supply/exhaust unit 50 and their positions are not limited to those shown in the drawing. Alternatively, the air supply/exhaust unit 50 may be provided on the lid 40 side.

A bottom surface of the bottom plate 23 is provided with at least three device positioning portions 24 that are supported by a positioning means of a conveying machine or a processing device.

An upper surface of the top plate 25 of the container body 20 is provided with a robotic flange 26 for conveyance (a first component for being conveyed) which is held by an overhead conveying system of a manufacturing plant. Lift flanges 27 (a second component for being conveyed) which are held by a conveying machine protrude along the front and rear direction. In addition, handles 29 (a third component for being conveyed) are provided at four places on right and left edges of the upper surface of the top plate 25 of the container body 20 so that operators can carry the panel storage container 1.

On the other hand, the lid 40 airtightly closes the opening 21 of the container body 20 via a seal gasket (not shown). The lid 40 has a lid body 41 and a locking mechanism 42 (lock means) for locking or unlocking the lid 40 that is for closing the opening 21 of container body 20. The locking mechanism 42 includes a latch (not shown) that moves between a lock position and an unlocked position in accordance with an operation of a key (not shown) inserted into a keyhole 43. The latch is engaged with or disengaged from an engaging portion (not shown) on the container body 20 side in order to lock and unlock the lid 40.

The container body 20 and the lid 40 are made by a combination of multiple components formed of metallic or resin materials. Examples of the resins contained in the molding materials of the resin components include polycarbonate, cycloolefin polymer, polyetherimide, polyether ketone, polyether ether ketone, polybutylene terephthalate, polyacetal, liquid crystal polymer, acrylic resin such as polymethyl methacrylate, thermoplastic resin such as acrylonitrile butadiene styrene copolymer and alloys thereof.

These resins may contain conductive materials made of carbon fibers, carbon powders, carbon nanotubes, conductive polymers and the like; and antistatic agents such as anions, cations and nonionic systems as necessary. Benzotriazole-based, salicylate-based, cyanoacrylate-based, oxalic acid anilide-based and hindered amine-based ultraviolet absorbers may be added. Also, glass fibers, carbon fibers and the like may be selectively added to improve the rigidity.

When priority is given to weight reduction, the right and left side walls 22a, 22b, the bottom plate 23 and the top plate 25 of the container body 20 are preferably made of aluminum. When priority is given to the strength, the right and left side walls 22a, 22b, the bottom plate 23 and the top plate 25 are preferably made of stainless steel.

The rear wall 28 of the container body 20 shown in FIG. 3 is entirely made of transparent resin materials so that the inside of container body 20 can be seen. However, the configuration is not limited thereto. A part of the rear wall 28 (e.g., a central part thereof) may be formed of transparent resin materials. The transparent resin materials are preferably acrylic resins, polycarbonate or cycloolefin polymers.

[Panel Support Portion]

Figure 4:
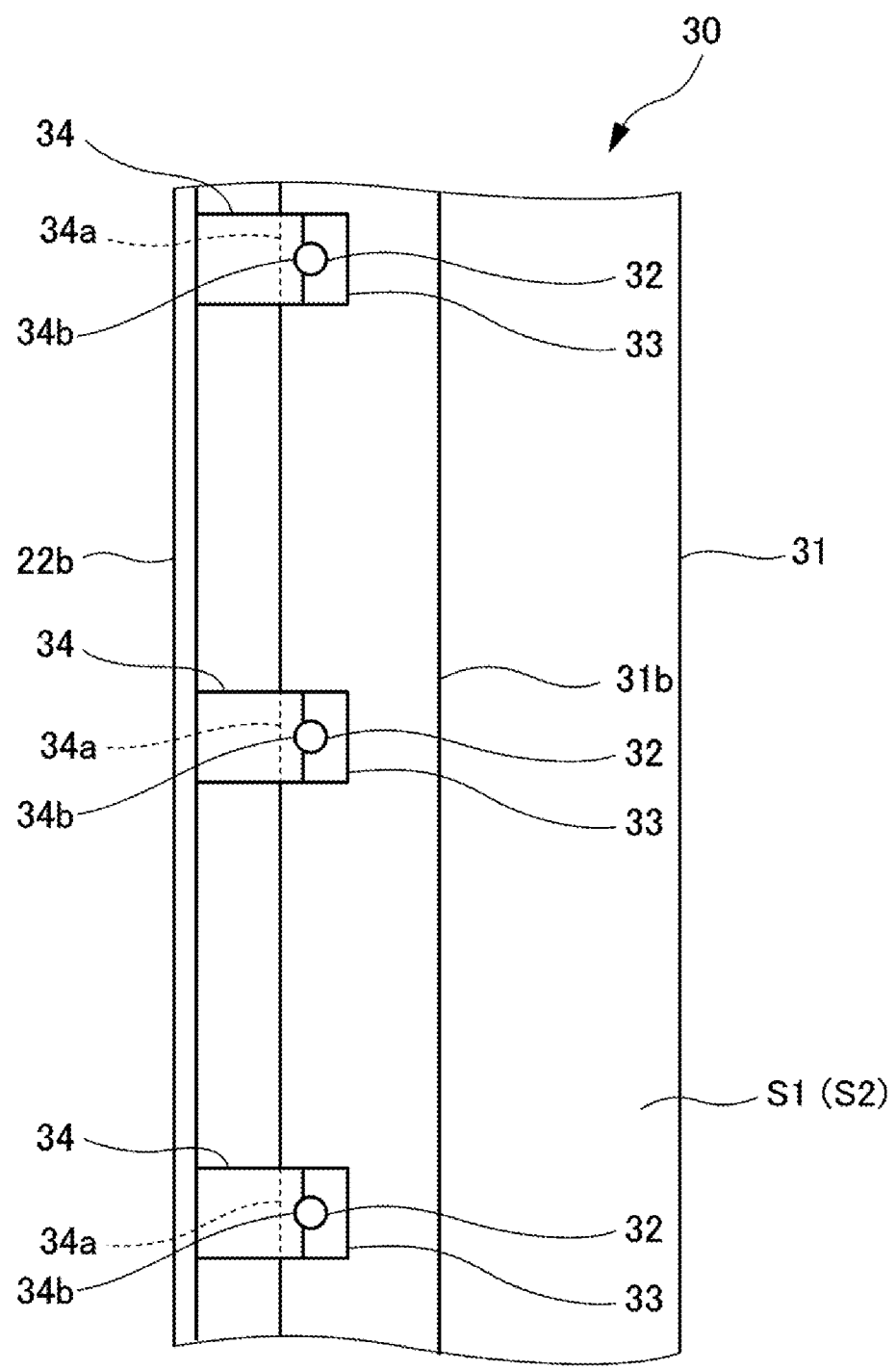
FIG. 4 is a plan view showing a main part of a panel support portion.
Figure 5:
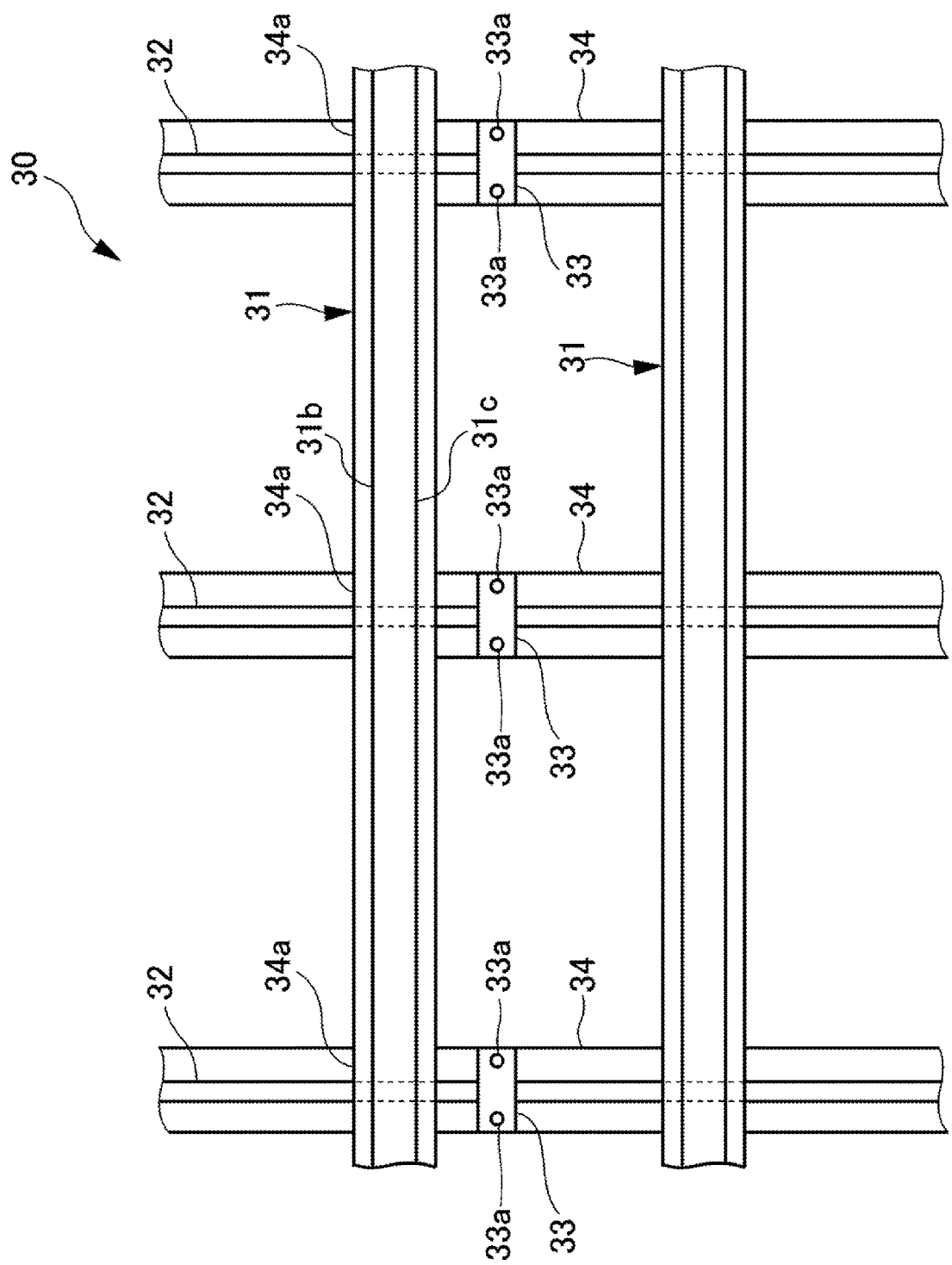
FIG. 5 is a side view showing the main part of the panel support portion.
Figure 6:
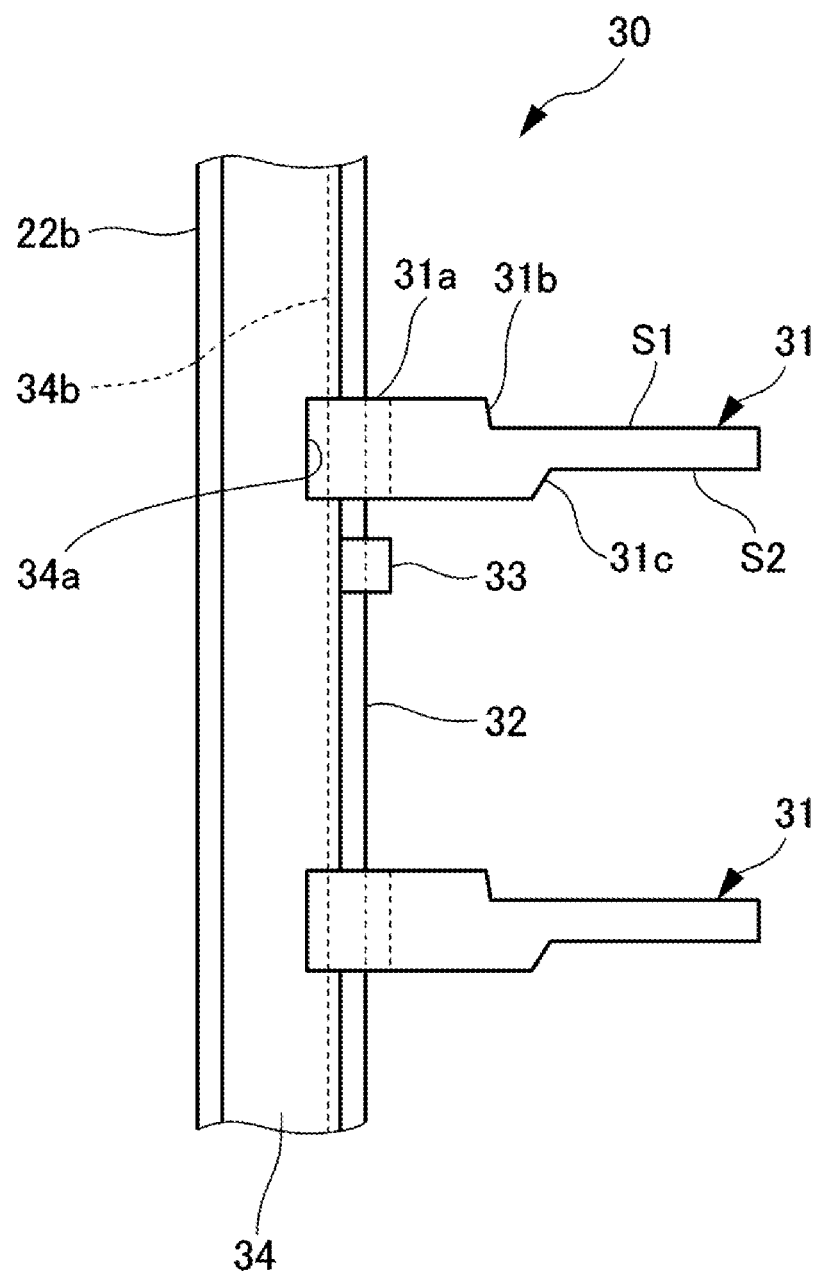
FIG. 6 is a front view showing the main part of the panel support portion.
Figure 7A:
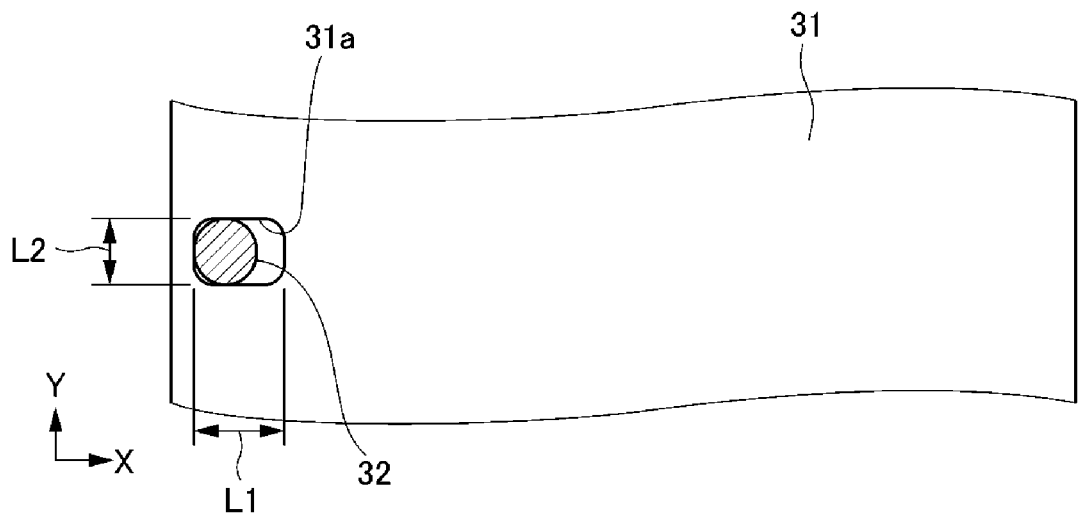
FIG. 7A is a plan view showing a main part of an attachment hole of an elongated-hole shape formed in a panel support body.
Figure 7B:
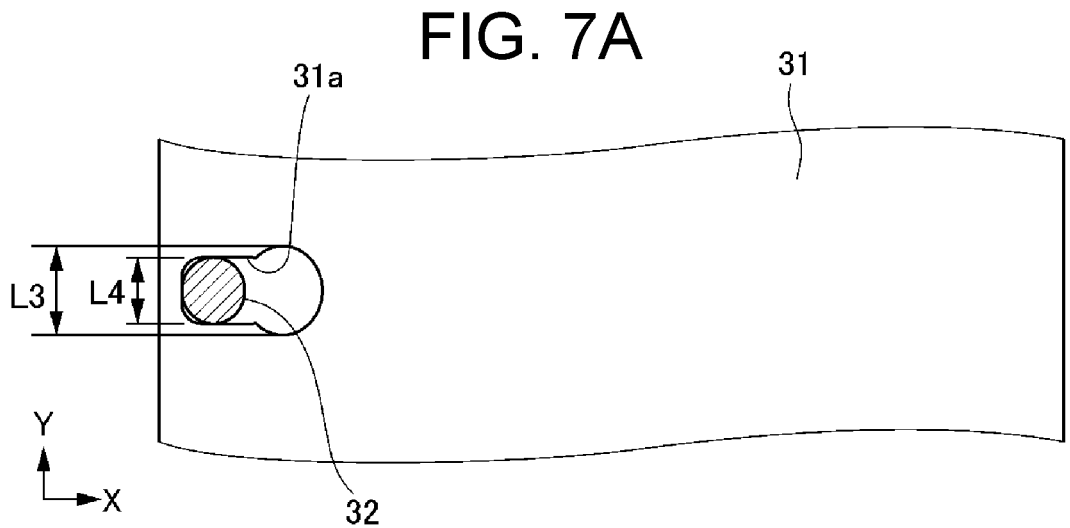
FIG. 7B is a plan view showing 4a main part of an attachment hole of a round-bottom-flask like shape formed in a panel support body.
Figure 7C:
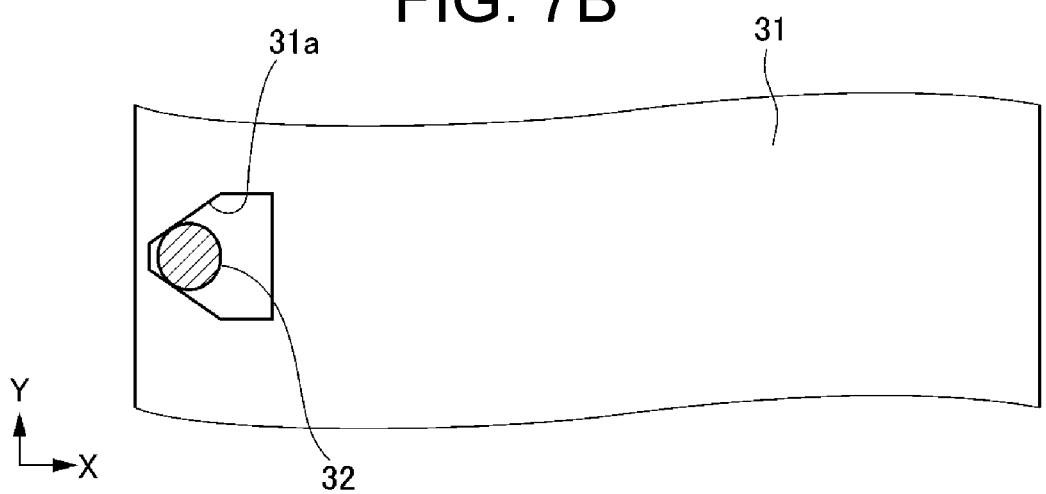
FIG. 7C is a plan view showing a main part of an attachment hole of a home-base like shape formed in a panel support body.

Next, the panel support portion 30 will be described in detail while referring to FIG. 4 to FIG. 8B. FIG. 4 is a plan view showing a main part of the panel support portion 30. FIG. 5 is a side view showing a main part of the panel support portion 30. FIG. 6 is a front view showing a main part of the panel support portion 30. FIGS. 7A, 7B and 7C are plan views each showing a main part of an attachment hole of an elongated-hole shape 31a, an attachment hole of a round-bottom-flask like shape 31a, and an attachment hole of a home-base like shape 31a formed in the panel support body 31, respectively. FIGS. 8A and 8B are schematic front views showing the panel support bodies 31 attached in changed directions with a panel positioning dimension A1 and a panel positioning dimension B1, respectively.

As shown in FIG. 4 to FIG. 8B, the panel support portion 30 includes: the panel support bodies 31 for supporting the right and left ends of the panels P; support shafts 32 inserted in attachment holes 31a formed in the base end side of the panel support bodies 31; and fixing walls (hereinafter, simply referred to as "support column 34") standing on the inner side of the side walls 22a, 22b of the container body 20, the support shafts 32 being fixed to the support column 34 via multiple fixing members 33.

According to the panel support portion 30 of the present embodiment, six panel support bodies 31, four support shafts 32, twelve fixing members 33 and four support columns 34 are provided respectively on the right and left sides. However, the quantities thereof can be appropriately changed in accordance with the number and weights of the panels P to be stored. For example, the panel support bodies 31 may be attached and fixed by two support shafts 32. One support shaft 32 may be attached and fixed to one support column 34 with two fixing members 33.

[Panel Support Body]

The panel support body 31 has a rectangular shape that is long in the front and rear direction in plane view. Each of the right and left edges of the panels P is supported by one panel support body 31. The materials forming the panel support bodies 31 are preferably conductive resin materials or metallic materials for antistatic purpose. The panel support bodies 31 of the present embodiment may be formed of conductive resin materials, such as rubber materials and elastomeric materials, which are more frictional than metallic materials to prevent slippage of the panels P and are more cushioning than metallic materials to prevent damages of the panels P.

On the base end side of each panel support body 31, multiple attachment holes 31a are formed at a predetermined interval in the front and rear direction so as to penetrate the panel support body 31 in the up and down direction. Further, the panel support body 31 has surfaces to support each panel P. These surfaces are provided with positioning stepped portions 31b and 31c for positioning the panel P. The shapes of the stepped portion 31b and 31c will be described later.

[Support Column]

Multiple support columns 34 are provided so as to stand on the inner sides of the side walls 22a, 22b of the container body 20 at a predetermined interval in the front and rear direction. The support columns 34 have fitting grooves 34a formed along the front and rear direction to fit and support the base ends of the panel support bodies 31. The fitting grooves 34a are formed in the inner surfaces of the support columns 34 at a predetermined interval in the up and down direction. To temporarily fix the panel support body 31 onto the support column 34, the base end of the panel support body 31 is fitted into the fitting grooves 34a at the same height on the support columns 34 arrayed in the front and rear direction. A backlash removing protrusion is preferably provided on the base end of the panel support body 31 that fits into the fitting groove 34a of the support column 34. This protrusion is crushed when fitted into the fitting groove 34a, removing backlash in fitting.

The inner surfaces of the support columns 34 are also provided, along the up and down direction, with engagement grooves 34b for engaging with the support shafts 32. When the support shaft 32 is fixed to the support column 34, the engagement grooves 34b can position, in the front and rear direction, the support shaft 32 on the support column 34. The engagement grooves 34b can also regulate deviation of the support shaft 32 in the front and rear direction after fixation.

The materials forming the support columns 34 are preferably conductive resin materials or metallic materials for antistatic purpose. The support columns 34 of the present embodiment are preferably formed of aluminum with priority on weight reduction. The support columns 34 are formed as different members from the side walls 22a, 22b. However, the support columns 34 may be integral with the side wall 22a, 22b.

[Support Shaft]

The support shafts 32 are inserted in the attachment holes 31a of the panel support bodies 31 that are temporarily fixed in the fitting grooves 34a of the support columns 34. The support shafts 32 are then secured to the support columns 34 with the multiple fixing members 33, thereby firmly holding the panel support bodies 31. The support shafts 32 of the present embodiment have a solid cylindrical or elliptical cylindrical shape or a hollow cylindrical shape. However, the shape may be prismatic. The fixing member 33 sandwiches the support shaft 32 with the support column 34. In that state, the fixing member 33 is fixed to the support column 34 with a pair of screws 33a on the right and left sides. As a result, the support shafts 32 are secured on the support column 34. However, the fixing structure of the fixing members 33 is not limited thereto.

The materials forming the support shafts 32 are preferably conductive resin materials or metallic materials for antistatic purpose. The support shafts 32 of the present embodiment are more preferably formed of stainless or aluminum.

[Shape of Attachment Hole]

As shown in FIGS. 7A to 7C, the attachment holes 31a formed in the panel support bodies 31 have a shape with the length L1 in the X direction (a direction connecting the distal end side and the base end side of the panel support body 31) longer than the length L2 of the support shaft 32 in the Y direction. For example, the attachment hole 31a shown in FIG. 7A has an elongated-hole shape which is long in the X direction. This shape allows positional deviation of the support shaft 32 in the X direction when inserting the support shaft 32, thereby improving the assemblability. After the support shaft 32 is inserted in the attachment hole 31a, the support shaft 32 is pushed onto an end of the attachment hole 31a on the base side of the panel support body 31. As a result, the support shaft 32 contacts the end of the attachment hole 31a at three points, thereby determining the positions of the panel support body 31 in the X and Y directions.

The attachment hole 31a shown in FIG. 7B has, on the distal end side of the panel support body 31, a portion larger than the outer profile of the support shaft 32. Specifically, the attachment hole 31a shown in FIG. 7B has a round-bottom-flask like shape. The length L3 in the Y direction on the distal end side of the panel support body 31 is longer than the length L4 which is the length in the Y direction of the attachment hole 31a of the elongated-hole shape shown in FIG. 7A. Such attachment hole 31a allows positional deviation of the support shaft 32 in the X and Y directions when inserting the support shaft 32, thereby improving the assemblability. After the support shaft 32 is inserted in the attachment hole 31a, the support shaft 32 is pushed onto the end of the attachment hole 31a on the base side of the panel support body 31. As a result, the support shaft 32 contacts the end of the attachment hole 31 a at three points, thereby determining the positions of the panel support body 31 in the X and Y directions.

The attachment hole 31a shown in FIG. 7C has a portion of which width in the Y direction becomes narrower than the outer profile of the support shaft 32 as proceeding in the direction from the distal end side to the base end side of the panel support body 31. Specifically, the attachment hole 31a shown in FIG. 7C has a triangular or home-base like shape with the vertex placed on the base end side of the panel support body 31. When inserting the support shaft 32, such attachment hole 31a allows positional deviation of the support shaft 32 in the X and Y directions, thereby improving the assemblability. After the support shaft 32 is inserted in the attachment hole 31a, the support shaft 32 is pushed onto the end of the attachment hole 31a on the base side of the panel support body 31. As a result, the support shaft 32 contacts the end of the attachment hole 31a at two points, thereby determining the positions of the panel support body 31 in the X and Y directions. The angle of the vertex of the attachment hole 31a is preferably 60° to 120°.

[Step Shape]

As shown in FIGS. 8A and 8B, the panel support body 31 can support the panel P on different surfaces in accordance with its selected attachment direction. The surfaces capable of supporting the panel P have different stepped shapes. Specifically, the panel support body 31 of the present embodiment has the surfaces capable of supporting the panel P: a first surface S1; and a second surface S2 which is the back side of the first surface S1. The first surface S1 has a first stepped portion 31b. The second surface S2 has a second stepped portion 31c. The first stepped portion 31b is on the base end side of the panel support body 31 as compared with the second stepped portion 31c. Note that, the panel P is supported at the right and left ends by the panel support bodies 31 on the right and left sides. As shown in FIG. 8A, when the panel support body 31 is attached such that the first surface S1 supports the panel P, the positioning dimension of the panel P in the right and left direction is A1. As shown in FIG. 8B, when the panel support body 31 is attached such that the second surface S2 supports the panel P, the positioning dimension of the panel P is B1 shorter than A1.

The panel positioning dimension A1 of the present embodiment is for positioning a carrier panel Pc. The dimension A1 is set by adding a predetermined clearance (e.g., 2 to 3 mm on each side) to the right to left width of the carrier panel Pc (e.g., 615 mm). The panel positioning dimension B1 is for positioning a sealing panel Pe. The dimension B1 is set by adding a predetermined clearance (e.g., 2 to 3 mm on each side) to the right to left width of the sealing panel Pe (e.g., 600 mm). Such panel support body 31 realizes the two panel positioning dimensions A1 and B1 based on the selection of the attachment direction. Hence, the manufacturing costs can be reduced as compared with the case where two types of panel support bodies 31 are manufactured in accordance with the panel positioning dimensions.

Each panel support body 31 is formed such that the height for supporting the panel P does not change even when the attachment direction of the panel support body 31 is changed. Specifically, the dimension C1 in the up and down direction from the upper step surface (the top surface on the base end side) to the lower step surface (the panel supporting surface) of the stepped portion 31b on the first surface S1 coincides with the dimension D1 in the up and down direction from the upper step surface (the top surface on the base end side) to the lower step surface (the panel supporting surface) of the stepped portion 31c on the second surface S2. Such panel support bodies 31 make it possible to store and take out the panels P of different sizes without changing height settings of the robots.

[Central Support Portion]

Figure 9A:
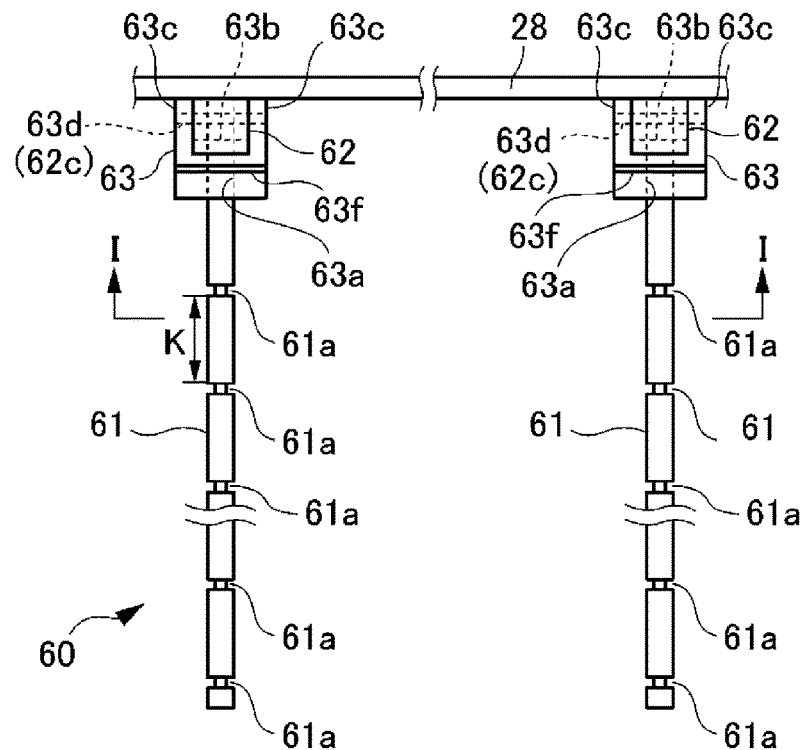
FIG. 9A is a plan view showing a main part of a central support portion without elastic bodies.
Figure 9B:
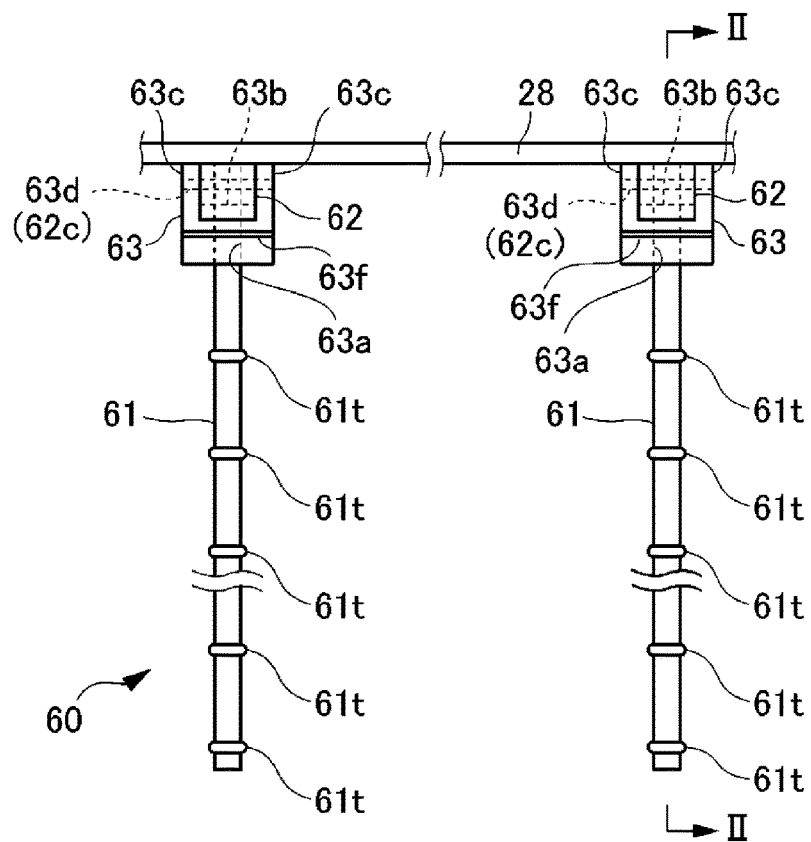
FIG. 9B is a plan view showing the main part of the central support portion with elastic bodies.
Figure 10:
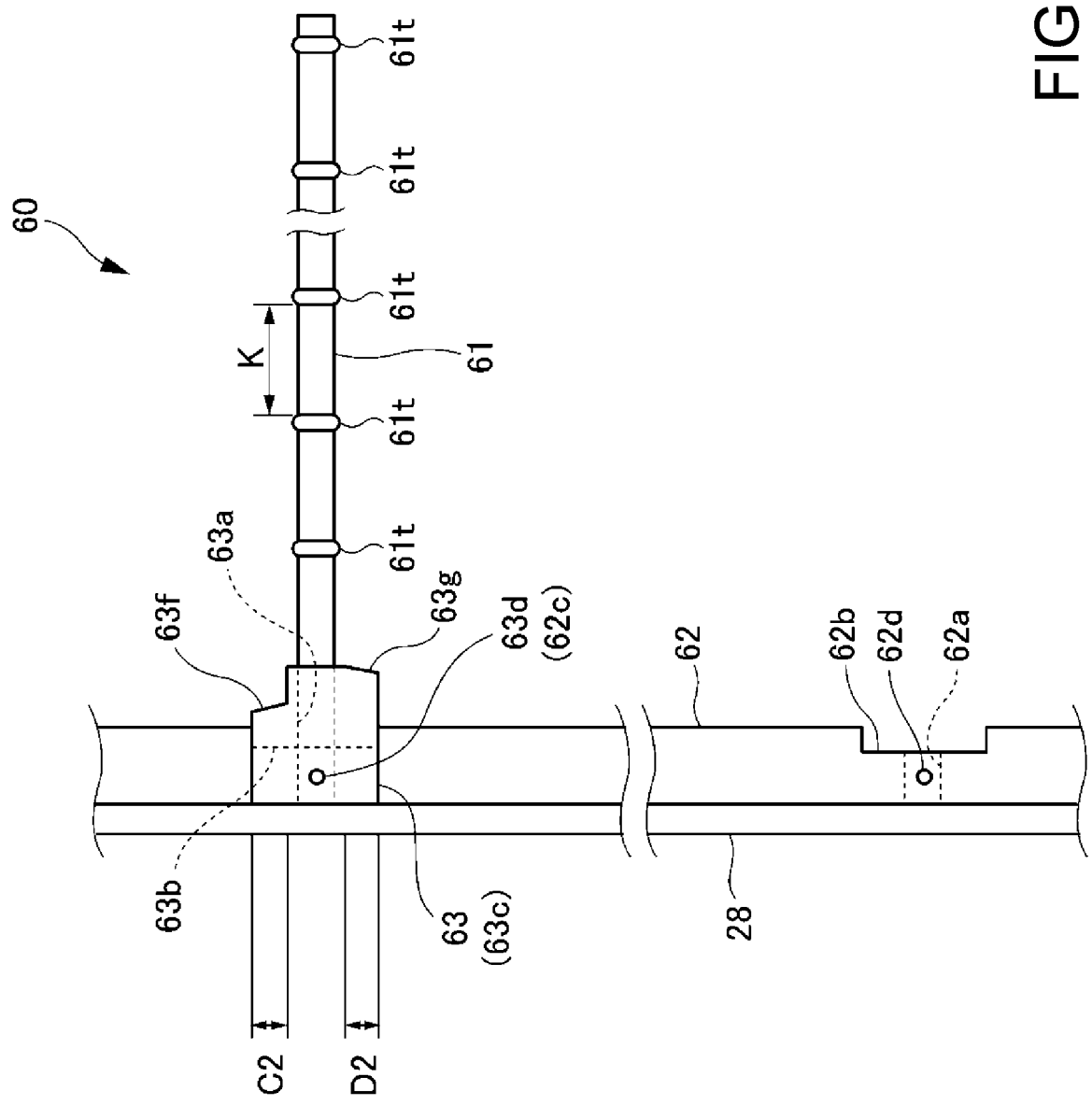
FIG. 10 is a side view showing the main part of the central support portion.
Figure 11:
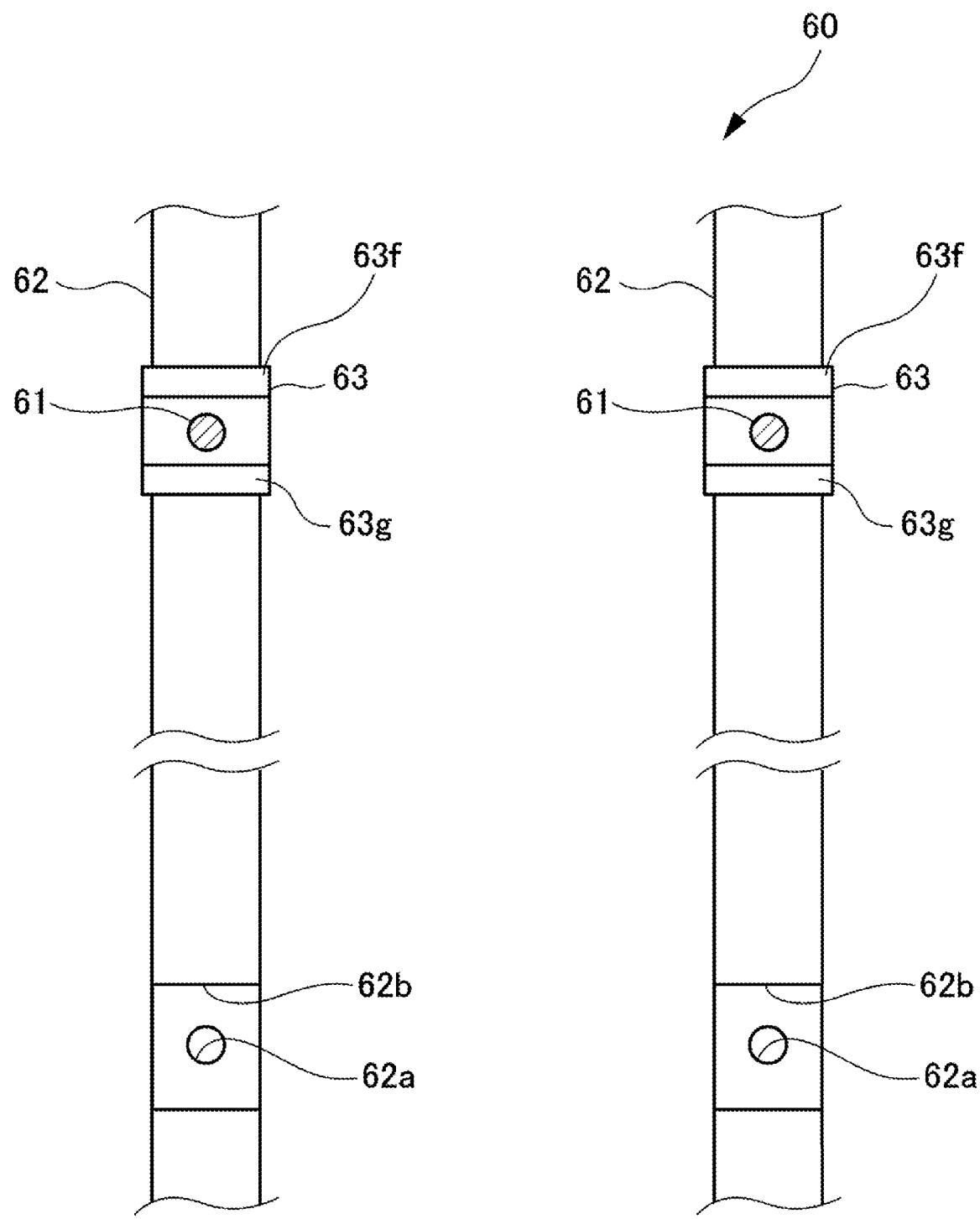
FIG. 11 is a sectional view taken along line I-I of FIG. 9A.
Figure 12:
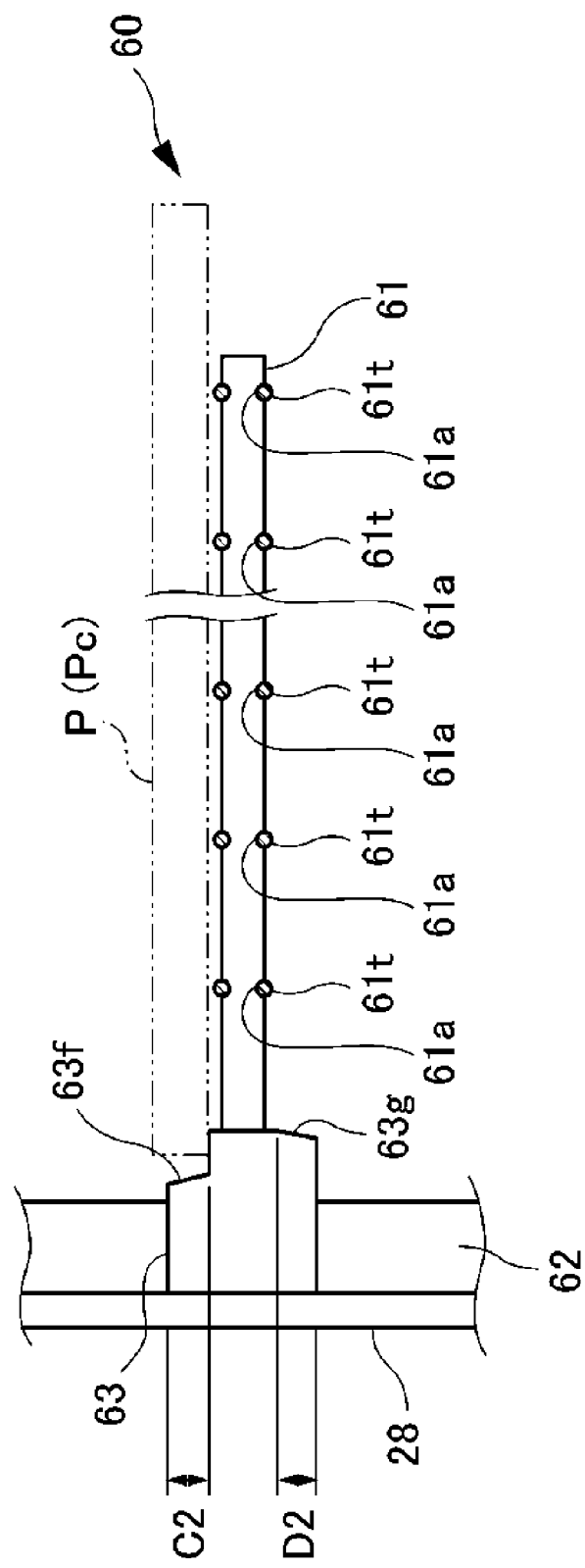
FIG. 12 is a sectional view taken along line II-II of FIG. 9B.

Next, a central support portion 60 will be described in detail while referring to FIG. 9A to FIG. 12. FIGS. 9A and 9B are plan views each showing a main part of a central support portion 60 without elastic bodies 61t and with elastic bodies 61t, respectively. FIG. 10 is a side view showing the main part of the central support portion 60. FIG. 11 is a sectional view taken along line I-I of FIG. 9A. FIG. 12 is a sectional view taken along line II-II of FIG. 9B. FIG. 10 and FIG. 11 are shown with lower central support portions 60 removed.

As shown in FIG. 9A to FIG. 12, the central support portion 60 includes: a pair of central support members 61 for supporting a lower surface of a middle portion of the panel P at positions apart from each other in the right and left direction; a pair of support columns 62 standing on the inner surface of the rear wall 28 at positions apart from each other in the right and left direction; and support holding members 63 for securing rear ends of the central support members 61 to the support columns 62.

The central support portion 60 includes twelve central support members 61, two support columns 62 and twelve support holding members 63. However, the quantities thereof can be appropriately changed in accordance with the number and weights of the panels P to be stored.

[Central Support Member]

The central support member 61 is a solid or hollow cylindrical member made of metals such as stainless steel or carbon fiber reinforced plastics. The central support member 61 extends along the front and rear direction. On a circumferential surface of the central support member 61, multiple elastic bodies 61t are provided to contact with the panel P supported by that central support member 61. The rear end of the central support member 61 is provided with a pin insertion hole into which a below mentioned retaining pin 62c is inserted, which is not shown. The outer diameter of the solid or hollow cylindrical central support member 61 is preferably a perfect circle or a substantially perfect circle.

The elastic bodies 61t have, for example, an annular shape (a ring shape) such as an O-ring. The neighboring elastic bodies 61t are provided along the front and rear direction at a predetermined interval K. From the standpoint of improving the positioning accuracy, the predetermined interval K is preferably in the range from 50 mm to 100 mm. The elastic bodies 61t are preferably formed in a circular shape in cross section as shown in FIG. 12 from the viewpoint of reducing scratches or scuffs caused by the contact with the panels P and improving the positioning accuracy of the panels P in the up and down direction (height direction).

The elastic bodies 61t may be formed of conductive rubber materials which are more frictional than metallic materials to prevent slippage of the panels P and are more cushioning than metallic materials to prevent damages on the panels P. Examples of the rubber materials include EPDM, silicone rubber and fluororubber.

On a circumferential surface of the central support member 61, multiple grooves 61a for fitting with the annular elastic bodies 61t are formed along the front and rear direction. The neighboring grooves 61a are provided at the predetermined interval K. The cross-section of the grooves 61a may be any shape capable of fitting to the annular elastic bodies 61t. The cross-section is preferably formed in a semicircular or arc shape correspondent with a part of the circular shape of the cross-section of the elastic bodies 61t so as to completely closely contact with the inner diameter of the annular elastic bodies 61t. The annular elastic bodies 61t are respectively fitted in the grooves 61a. Since the elastic bodies 61t are thus positioned in the grooves 61a, it is possible to effectively suppress displacement of the elastic bodies 61t in the front and rear direction caused by the contact with the panels P. It is also possible to improve the positioning accuracy of the panels P in the up and down direction.

According to such elastic bodies 61t, the annular elastic bodies 61t can be easily mounted on the solid or hollow cylindrical central support members 61. Hence, it is possible to improve the assembly workability of the overall container body 20. In addition, since the elastic bodies 61t contact with the panels P at points, the contact area between the panel P and the elastic bodies 61t can be reduced as much as possible, thereby effectively reducing scratches or scuffs caused by the contact between the panels P and the elastic bodies 61t.

From the viewpoint of suppressing: flexure and deformation of the middle portions of the panels P; and vibration of the central support members 61, each central support member 61 preferably supports 3/4 or more of the total area of the middle portion of the panel P in the front and rear direction, not all of the total area of the middle portion of the panel P in the front and rear direction.

[Support Column]

Two support column 62 are provided on the inner surface of the rear wall 28 with a predetermined distance in the right and left direction. The support columns 62 are formed as different members from the rear wall 28. However, the support columns 62 may be integral with the rear wall 28.

Each support column 62 is formed with: a fitting recess 62a in a circular hole shape for fitting and supporting the base end of the central support member 61; a fitting groove 62b for fitting and supporting a part of the support holding member 63; and a pin insertion hole 62d into which a retaining pin 62c is inserted for retaining the fitted central support member 61 and the fitted support holding member 63.

The materials forming the support columns 62 may be conductive resin materials or metallic materials for antistatic purpose. The support columns 62 of the present embodiment are formed of metallic materials, since priority is given to the strength for supporting the central support members 61.

[Support Holding Member]

The support holding members 63 are formed of resin materials. Each support holding member 63 includes: a support insertion hole 63a into which the rear end of the central support member 61 is inserted; a fitting portion 63b that fits into the fitting groove 62b of the support column 62 to define the vertical position of the support holding member 63; a pair of abutting portions 63c on right and left that abut the right and left sides of the support column 62 to define the horizontal position of the support holding member 63; a pin insertion hole 63d for receiving the aforementioned retaining pin 62c; and a first positioning portion 63f and a second positioning portion 63g for positioning the panel P in the front and rear direction. The positions of the first positioning portion 63f and the second positioning portion 63g are different from each other in the front and rear direction.

In order to fix the rear end of the support holding member 63 to the support column 62, the fitting portion 63b of the support holding member 63 is firstly fitted into the fitting groove 62b of the support column 62. Then, the rear end of the support holding member 63 is fitted into the fitting recess 62a of the support column 62 via the support insertion hole 63a of the support holding member 63. In this state, when the retaining pin 62c is inserted into the pin insertion hole 63d of the support holding member 63, the retaining pin 62c penetrates the pin insertion hole 62d of the support column 62 and the pin insert hole of the central support member 61, thereby preventing the central support member 61 and the support holding member 63 from falling from the support column 62.

Each support holding member 63 is formed such that the height for supporting the central support member 61 does not change even when the attachment direction of the support holding member 63 is changed. Specifically, the dimension C2 of the first positioning portion 63f in the up and down direction coincides with the dimension D2 of the second positioning portion 63g in the up and down direction. Such support holding members 63 make it possible to store or take out the panels P of different sizes without changing for the robots the insertion height of the panels P or without changing for the robots the insertion amount of the panels P.

The first positioning portion 63f of the present embodiment is for positioning the carrier panels Pc. The second positioning portion 63g of the present embodiment is for positioning the sealing panel Pe. Such support holding member 63 realizes the storage of two types of panels based on the selection of the attachment direction. Hence, the manufacturing costs can be reduced as compared with the case where two types of the positioning members are manufactured in accordance with the sizes of the panels.

As shown in FIG. 12, each central support member 61 is formed such that its front end in the front and rear direction is positioned backward as compared with the front edge of the middle portion of the panel P in a state where the panel P is stored in the storage container body 20, i.e. where the carrier panel Pc is supported by the central support members 61 such that the rear end of the carrier panel Pc in the front and rear direction abuts the first positioning portion 63f or where the sealing panel Pe is supported by the central support members 61 such that the rear end of the sealing panel Pe in the front and rear direction abuts the second positioning portion 63g. In other words, each central support member 61 is intended to support not the total area of the middle portion of the panel P in the front and rear direction but a partial area of the middle portion of the panel P in the front and rear direction. Thereby, vibration of the central support member 61 can be suppressed compared with the central support member that supports the total area of the middle portion of the panel P in front and rear direction.

[Effects of Embodiments]

According to the above-described panel container 1 of the present embodiment, the panel container 1 includes: the container body 20 for storing the multiple panels P; and the panel support means for supporting the panels P. The panel support means includes: the panel support portions 30 for supporting the right or left ends of the panels P; the central support portions 60 that extend along the front and rear direction and support the central portions of the panels P; and the elastic bodies 61t that contact with the panels P. Since the elastic bodies 61t are provided along the front and rear direction of the central support portions at a predetermined interval, it is possible to store large panels P while suppressing flexure and deformation of the middle portions of the panels P. It is also possible to reduce the contact area between the panels P and the elastic bodies 61t, thereby reducing scratches or scuffs caused by the contact between the panels P and the elastic bodies 61t.

In addition, the multiple annular elastic bodies 61t are fitted into grooves 61a provided on the circumferential surfaces of the solid or hollow cylindrical central support members 61 so as to closely contact with the central support members 61. Thus, the contact area between the central support members 61 and the elastic bodies 61t becomes smaller, facilitating the mounting of the elastic bodies 61t onto the central support members 61 and reducing height variations of the panels P supported by the multiple elastic bodies 61t. Hence, the positioning accuracy of the panels P in the up and down direction can be improved, while the container body 20 can be dried well after cleaning. Further, since the multiple annular elastic bodies 61t are general ones, the costs for the central support portions 60 can be reduced.

[Variants]

Next, variants according to the present disclosure will be described.

In the present embodiment, the pair of central support members 61 is formed so as not to be connected, but the configuration is not limited thereto. For example, front ends of the central support members 61 in the front and rear direction may be connected via connecting members or the like. In this case, it is possible to further suppress vibration of the central support members 61.

In the present embodiment, the central support members 61 are configured in pair, but the configuration is not limited thereto and may include only one central support member 61 or three central support members 61, for example.

In the present embodiment, the elastic bodies 61t are the annular elastic bodies provided on the entire circumference of the circumferential surface of each central support member 61. However, the configuration is not limited thereto. The elastic bodies 61t may be, for example, non-annular elastic bodies provided on a part of the circumferential surface of each central support member 61.

For example, the non-annular elastic bodies preferably have a substantially C shape in cross section with a part thereof cut off. In this case, the elastic bodies 61t are easily attached and detached on and from the central support members 61 and are securely fixed by the elasticity.

Further, in the present embodiment, the central support members 61 are the solid or hollow cylindrical members, and the elastic bodies 61t are the annular elastic bodies. However, the configuration is not limited thereto. For example, the central support members 61 may be prismatic members, and the elastic bodies 61t may be the annular elastic bodies. In this case, the contact between the panels P and the elastic bodies 61t is line contact or surface contact. Hence, the frictional property becomes higher than that of the point contact, effectively preventing slippage of the panels P that the elastic bodies 61t support.

Figure 13C:
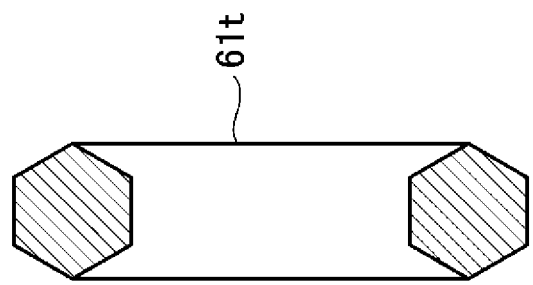
FIG. 13C is a diagram of a modified elastic body with a cross section of a six polygonal shape.
Figure 13B:
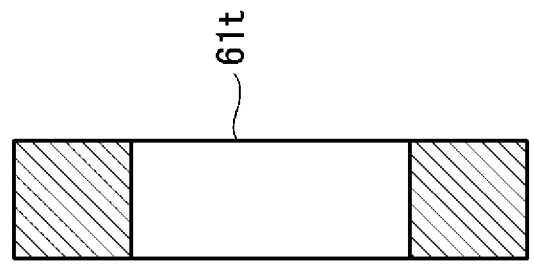
FIG. 13B is a diagram of a modified elastic body with a cross section of a square shape.
Figure 13A:
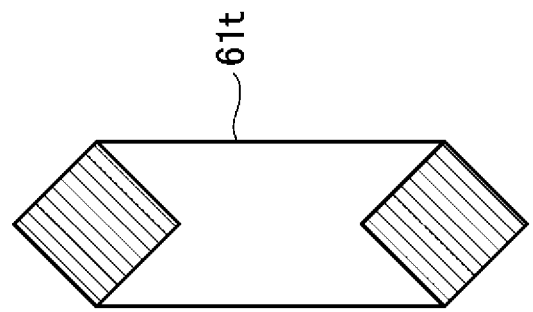
FIG. 13A is a diagram of a modified elastic body with a cross section of a rhombus shape.

FIGS. 13A to 13C are diagrams of modified annular elastic bodies 61t respectively with a cross section of a rhombus shape, a square shape and a six polygonal shape.

In addition, in the present embodiment, each annular elastic body 61t has a cross section of a circular shape, but the shape is not limited thereto. For example, the cross section may be a rhombus shape shown in FIG. 13A, so that the contact with the panel P is point contact. The cross section may be a polygonal shape shown in FIGS. 13B and 13C, so that the contact with the panel P is line contact from the viewpoint of enhancing the frictional property to effectively prevent slippage of the panel P that the elastic bodies 61t support.

In the present embodiment, although the multiple circular elastic bodies 61t are formed in the same outer diameter (in the same specifications), the configuration is not limited thereto. For example, the outer diameter may vary depending on the positions of the elastic bodies 61t on the central support members 61. For example, the elastic bodies 61t located on the front end side in the front and rear direction of the central support members 61 may have a larger outer diameter than that of the elastic bodies 61t located on the rear end side in the front and rear direction of the central support members 61. Thereby, the entire central portion of each panel P can be supported at the same height even when the central support members 61 are bent by their own weights.

Further, in the present embodiment, the multiple elastic bodies 61t are formed of the same materials (rubber materials), but the configuration is not limited thereto. For example, the elastic bodies 61t may be formed of different types of materials as required.

Second Embodiment

In the above described first embodiment, the support means of the panel storage container 1 comprises: the panel support portion 30 supporting the right and left ends of the panels P; and the central support portion 60 supporting the middle portions of the panels P. In the second embodiment, the support means of the panel storage container 1 also comprises a side support portion 70 in addition to the panel support portion 30 and the central support portion 60.

Hereinafter, the panel storage container 1 of the second embodiment will be described while referring to FIG. 14 to FIG. 16B. Note that, in the second embodiment, descriptions of the same points as those of the first embodiment will be omitted, and the points mainly differing from those of the first embodiment will be described.

Figure 14:
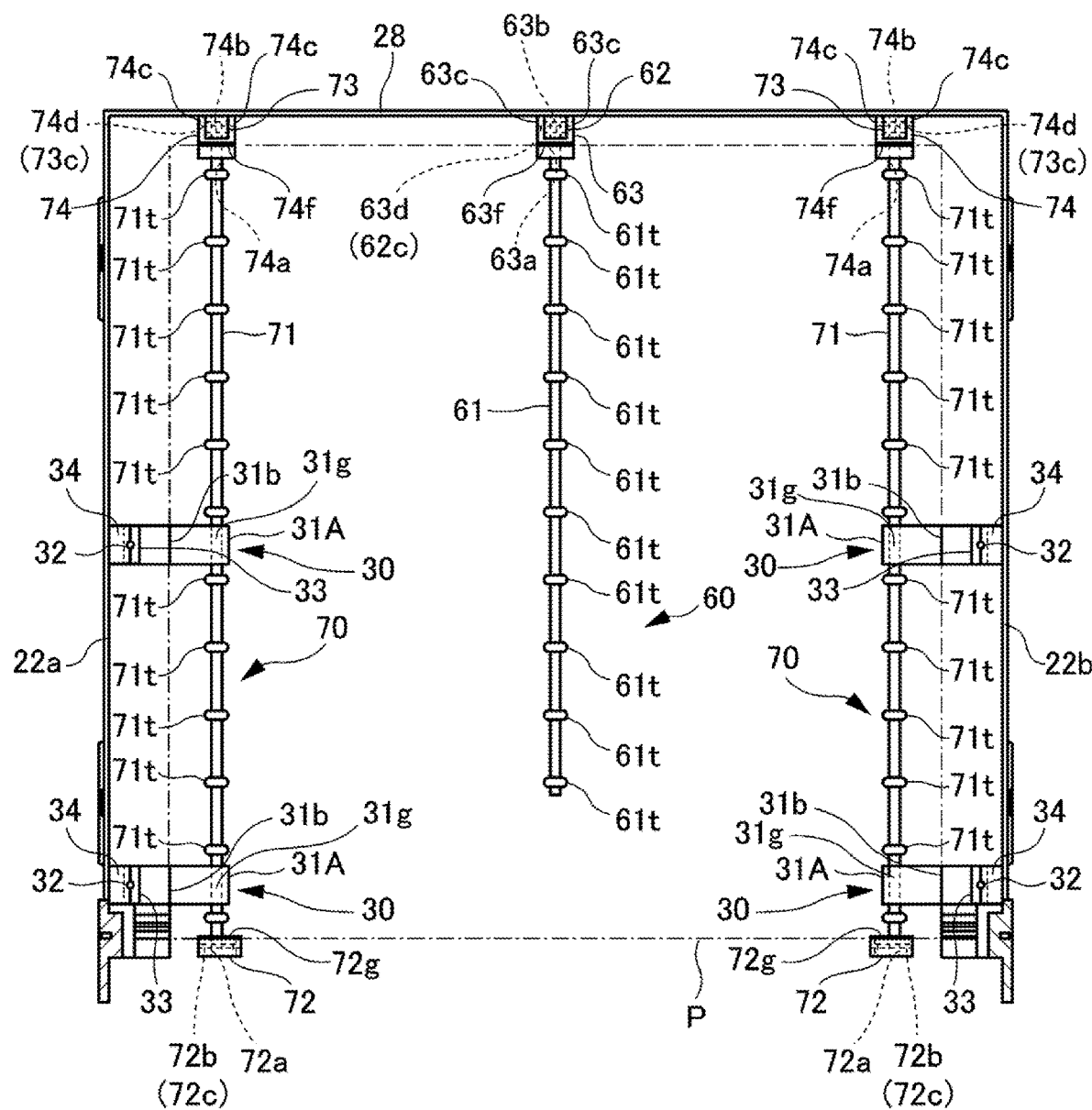
FIG. 14 is a plan view showing a main part of a panel support means of a second embodiment according to the present invention.
Figure 15:
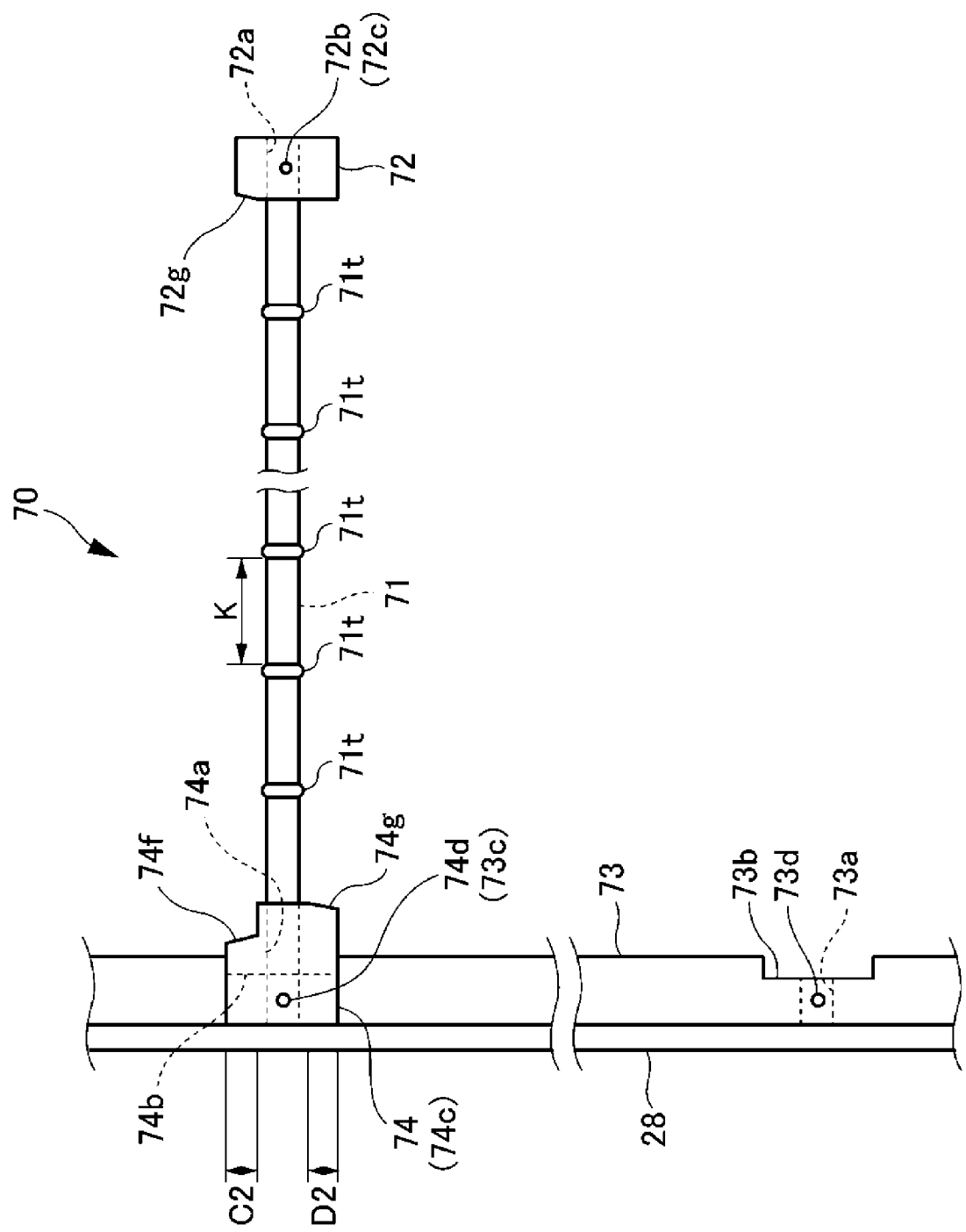
FIG. 15 is a main part side view showing a side support portion.

FIG. 14 is a plan view showing a main part of the panel support means of the second embodiment according to the present disclosure. FIG. 15 is a main part side view showing the side support portion. FIGS. 16A and 16B are schematic side views showing the side support portions attached in changed directions with a panel positioning dimension A2 and a panel positioning dimension B2, respectively.

[Central Support Portion]

In the second embodiment, the central support portion 60 includes single central support member 61 having multiple elastic bodies 61t at a predetermined interval, whereas in the first embodiment, the central support portion 60 includes a pair of central support members 61, which is a difference. In the other points, the central support portion 60 of the second embodiment is same as that of the first embodiment so that explanations will be omitted.

[Panel Support Portion]

The panel support portion 30 of the second embodiment includes panel support bodies 31A, support shafts 32, fixing members 33 and support columns 34. The support shafts 32, the fixing members 33 and the support columns 34 of the second embodiment are same as those of the above described first embodiment so that explanations will be omitted.

On the other hand, the panel support bodies 31A of the second embodiment are different from the panel support bodies 31 of the first embodiment. Each panel support body 31A has a long strip shape of which dimension in the right and left direction is longer than that in the front and rear direction. Multiple panel support bodies 31A are arrayed at a predetermined interval in the front and rear direction. In addition, each panel support body 31Aa has, on its distal end side, a through hole 31g penetrating in the front and rear direction such that the side support portion 70 can penetrate therethrough.

[Side Support Portion]

The side support portion 70 supports a portion different from the middle portion of the panel P. As shown in FIG. 14 and FIG. 15, the side support portion 70 includes: a pair of side support members 71 provided adjacent to the side walls 22a, 22b of the container body 20 along in the front and rear direction of the container body 20; stopper members 72 provided on front ends of the pair of side support members 71 that extend in the front and rear direction; a pair of support columns 73 provided on the inner surface of the rear wall 28 at positions spaced apart from each other in the right and left direction, the support columns 73 being correspondent with the pair of side support members 71; and a pair of support holding members 74 for fixing rear ends of the side support members 71 to the support columns 73.

[Side Support Member]

Similarly to the central support members 61, each side support member 71 is a solid or hollow cylindrical member made of metals such as stainless steel or carbon fiber reinforced plastics. The side support members 71 extend along the front and rear direction. On a circumferential surface of each side support member 71, multiple grooves 71a are provided for fitting with the elastic bodies 71t that contact with the panel P supported by these elastic bodies 71t. Further, the front and rear ends of each side support member 71 are provided with pin insertion holes into which after-mentioned retaining pins 72b and 73c are respectively inserted, which is not shown. Since each side support member 71 is intended to support the total area in the front and rear direction of the panel P, the side support members 71 are formed longer than the central support members 61.

Further, since the elastic bodies 71t and the grooves 71a of the side support members 71 are same as the elastic bodies 61t and the grooves 61a of the central support members 61 respectively, these detailed explanations will be omitted. Each side support portion 71 has multiple elastic bodies 71t at a predetermined interval.

The pair of side support members 71 are provided so as to be respectively connected with the multiple panel support bodies 31A attached on the side walls 22a and 22b.

Specifically, the distal end side of each panel support body 31A is formed with a through hole 31g penetrating in the front and rear direction, through which the cylindrical member of the side support member 71 is insert so as to fit therein. In this case, in portions of the cylindrical member of the side support member 71 that are exposed from the through holes 31g, multiple grooves 71a are provided. Hence, it is possible to mount the panel support bodies 31A between the neighboring grooves 71a. In other words, the dimension of each panel support body 31A in the front and rear direction is formed to be smaller than the predetermined interval K between the neighboring grooves 71a.

Alternatively, a concave groove extending along the front and rear direction may be provided on the panel supporting surface of each panel support body 31A on the distal end side. Each side support member 71 may be mounted in the concave grooves with the upper end protruding from the panel supporting surface or being flush with the panel supporting surface.

[Stopper Member]

The stopper members 72 are formed of resin materials and position each panel P in the front and rear direction. Each stopper member 72 includes: a support insertion hole 72a into which the front end of the side support member 71 is inserted; a pin insertion hole 72c into which a retaining pin 72b is inserted, the retaining pin 72b retaining the side support member 71 that is inserted in the support insertion hole 72a; and a positioning portion 72g for positioning the panel P in the front and rear direction.

[Support Column]

The support columns 73 are provided so as to stand on the inner surface of the rear wall 28 at positions apart from each other in the right and left direction. The support columns 73 are formed as different members from the rear wall 28. However, the support columns 73 may be integral with the rear wall 28.

Each support column 73 is formed with: a fitting recess 73a in a circular hole shape for fitting and supporting the rear end of the side support member 71; a fitting groove 73b for fitting and supporting a part of the support member 74; and a pin insertion hole 73d into which a retaining pin 73c for retaining the fitted side support member 71 and the fitted support holding member 74 is inserted.

The materials forming the support columns 73 may be conductive resin materials or metallic materials for antistatic purpose. The support columns 73 of the present embodiment are formed of metallic materials, since priority is given to the strength for supporting the side support members 71.

[Support Holding Member]

The support holding members 74 are formed of resin materials. Each support holding member 74 includes: a support insertion hole 74a into which the rear end of the side support member 71 is inserted; a fitting portion 74b that fits into the fitting groove 73b of the support column 73 to define the vertical position of the support holding member 74; a pair of abutting portions 74c on right and left that abut the right and left sides of the support column 73 to define the horizontal position of the support holding member 74; a pin insertion hole 74*d* for inserting the aforementioned retaining pin 73*c*; and a first positioning portion 74*f* and a second positioning portion 74*g* for positioning the panel P in the front and rear direction.

In order to fix the rear end of the support holding member 74 to the support column 73, the fitting portion 74*b* of the support holding member 74 is firstly fitted into the fitting groove 73*b* of the support column 73. Then, the rear end of the support holding member 74 is fitted into the fitting recess 73*a* of the support column 73 via the support insertion hole 74*a* of the support holding member 74. In this state, when the retaining pin 73*c* is inserted into the pin insertion hole 74*d* of the support holding member 74, the retaining pin 73*c* penetrates the pin insertion hole 73*d* of the support column 73 and the pin insert hole of the side support member 71, thereby preventing the side support member 71 and the support holding member 74 from falling from the support column 73.

Note that, as shown in FIGS. 16A and 16B, the support holding member 74 can be attached to the support column 73 in an inverted manner. In the attachment state shown in FIG. 16A, the first positioning portion 74*f* is enabled. In the attachment state shown in FIG. 16B, the second positioning portion 74*g* is enabled. The positions of the first positioning portion 74*f* and the second positioning portion 74*g* are different from each other in the front and rear direction position. In an attachment state shown in FIG. 16A, A2 is a positioning dimension of the panel P in the front and rear direction, the dimension being defined between the first positioning portion 74*f* and the positioning portion 72*g* of the stopper member 72. In an attachment state shown in FIG. 16B, B2 is a positioning dimension of the panel P in the front and rear direction, the dimension being defined between the second positioning portion 74*g* and the positioning portion 72*g* of the stopper member 72.

Each support holding member 74 is formed such that the height for supporting the side support member 71 does not change even when the attachment direction of the support holding member 74 is changed. Specifically, the dimension C2 of the first positioning portion 74*f* in the up and down direction coincides with the dimension D2 of the second positioning portion 74*g* in the up and down direction. Such support holding members 74 make it possible to store or take out the panels P of different sizes without changing for the robots the insertion height of the panels P or without changing for the robots the insertion amount of the panels P.

Although each side support member 71 may contact the panel P together with the multiple panel support bodies 31A as described above, only one panel support body 31A may be provided and connected to the side support member 71.

As described above, according to the panel storage 1 of the second embodiment, the panel support means includes: the central support portions 60 supporting the middle portions of the panels P in the right and left direction; the panel support portions 31A supporting the left and right edges of the panels P; and the side support portions 70 extending along the front and rear direction and being attached to the container body 20 at one edge. The side support portions 70 include the multiple elastic bodies 71*t* and are provided so as to be connected to the panel support portions 31A. The neighboring elastic bodies 71*t* are provided at a predetermined interval along the front and rear direction. Therefore, the panel storage 1 of the second embodiment can realize the same effects as those of the first embodiment. Also, the panel storage 1 of the second embodiment can suppress vibrations of the panel support bodies 31A and can reduce the contact area between the panels P and the elastic bodies 71*t*, thereby reducing scratches, scuffs and the like caused by the contact between the panels P and the elastic bodies 71*t*.

[Variants]

In the present embodiment, each side support portion 70 is provided with a stopper member 72 for positioning of the panel P in the front and rear direction, but the configuration is not limited thereto. For example, instead of the stopper member 72, an elastic body 71*t* having a larger diameter than the other elastic bodies 71*t* may be provided as a stopper on the front end in the front and rear direction of the side support member 71.

Further, in the present embodiment, the elastic bodies 61*t* and the elastic bodies 71*t* are formed of the same materials (rubber materials), but the configuration is not limited thereto. For example, the elastic bodies 61*t*, 71*t* may be formed of different types of materials as required.

In addition, in the present embodiment, the predetermined interval between the elastic bodies 61*t* is same as the predetermined interval between the elastic bodies 71*t*, but the configuration is not limited thereto. For example, the predetermined interval between the elastic bodies 61*t* may be larger or smaller than the predetermined interval between the elastic bodies 71*t* as required.

The cross-sectional shapes of the central support portions 60 and the side support portions 70 are preferably circular, but the shape is not limited thereto. It may be a quadrangular prism shape.

Hereinbefore, the panel storage container of the present disclosure has been described based on the specific embodiments, but the present invention is not limited to the specific embodiments described above. The technical scope of the present invention includes various modifications and improvements within the scope in which the objects of the present invention are achieved, which is obvious to a person skilled in the art from the description of the claims.

In the above embodiments, the upper, lower, left side, right side and rear surfaces are airtightly covered by the wall members in order to replace the air inside the panel storage container 1 with inert gas. However, the configuration is not limited thereto. For example, when airtightness is not required, the container 1 may be a frame member assembled in a rectangular parallelepiped shape. The wall members covering the periphery may be omitted.

Further, in the above embodiments, the stored panels P have a relatively small dimensional difference between the carrier panel Pc and the sealing panel Pe, but the present invention is not limited thereto. The panels P that have a large dimensional difference may be stored (e.g., 625 mm×615 mm and 300 mm×300 mm).

The invention claimed is:
1. A panel storage container comprising:
    a container body for storing panels; and
    a panel support means for supporting the panels,
    wherein the panel support means includes:
        a panel support body for supporting right and left edges of the panels;
        a central support portion that extends along a front and rear direction and supports each middle portion of the panels; and
        elastic bodies contacting the panels,
        wherein the elastic bodies are provided along a front and rear direction of the central support portion at a predetermined interval;
    wherein the panel support means includes a side support portion that extends along a front and rear direction and of which one end is attached to the container body; and the elastic bodies are provided along the front and rear direction of the side support portion at a predetermined interval.

2. The panel storage container according to claim 1, wherein the elastic bodies are annular shaped.

3. The panel storage container according to claim 2, wherein the cross section of the elastic bodies is formed in a circular shape.

4. The panel storage container according to claim 1, wherein
the side support portion is a solid or hollow cylindrical member.

5. The panel storage container according to claim 1, wherein the central support portion is a solid or hollow cylindrical member.

6. The panel storage container according to claim 4, wherein
multiple grooves for fitting with the elastic bodies are provided on a circumferential surface of the solid or hollow cylindrical member.

7. The panel storage container according to claim 1, wherein the predetermined interval ranges from 50 mm to 100 mm.

8. The panel storage container according to claim 1, wherein
a rear end of the central support portion in the front and rear direction is attached to the container body via a support holding member, and a front end of the central support portion in the front and rear direction is positioned backward of a front edge of the middle portion of each panel stored in the container body.

9. The panel storage container according to claim 5, wherein
multiple grooves for fitting with the elastic bodies are provided on a circumferential surface of the solid or hollow cylindrical member.

10. A panel storage container comprising:
a container body for storing panels; and
a panel support means for supporting the panels,
wherein the panel support means includes:
a panel support body for supporting right and left edges of the panels;
a central support portion that extends along a front and rear direction and supports each middle portion of the panels; and
elastic bodies contacting the panels,
wherein the elastic bodies are provided along a front and rear direction of the central support portion at a predetermined interval;
wherein the central support portion is a solid or hollow cylindrical member;
wherein multiple grooves for fitting with the elastic bodies are provided on a circumferential surface of the solid or hollow cylindrical member.

11. A panel storage container comprising:
a container body for storing panels; and
a panel support means for supporting the panels,
wherein the panel support means includes:
a panel support body for supporting right and left edges of the panels;
a central support portion that extends along a front and rear direction and supports each middle portion of the panels; and
elastic bodies contacting the panels,
wherein the elastic bodies are provided along a front and rear direction of the central support portion at a predetermined interval;
wherein a rear end of the central support portion in the front and rear direction is attached to the container body via a support holding member, and a front end of the central support portion in the front and rear direction is positioned backward of a front edge of the middle portion of each panel stored in the container body.

* * * * *